United States Patent
Go et al.

(10) Patent No.: US 11,869,568 B2
(45) Date of Patent: Jan. 9, 2024

(54) MEMORY DEVICE FOR PERFORMING SMART REFRESH OPERATION AND MEMORY SYSTEM INCLUDING THE SAME

(71) Applicant: SK hynix Inc., Gyeonggi-do (KR)

(72) Inventors: Byeong Yong Go, Gyeonggi-do (KR); Woongrae Kim, Gyeonggi-do (KR); Yoonna Oh, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 151 days.

(21) Appl. No.: 17/591,982

(22) Filed: Feb. 3, 2022

(65) Prior Publication Data

US 2023/0077248 A1     Mar. 9, 2023

(30) Foreign Application Priority Data

Sep. 6, 2021     (KR) .................. 10-2021-0118434

(51) Int. Cl.
 *G11C 11/406*     (2006.01)
 *G11C 29/00*     (2006.01)
 *G11C 11/4096*     (2006.01)

(52) U.S. Cl.
 CPC .... *G11C 11/40615* (2013.01); *G11C 11/4096* (2013.01); *G11C 29/72* (2013.01)

(58) Field of Classification Search
 None
 See application file for complete search history.

(56) References Cited

U.S. PATENT DOCUMENTS

| | | | | |
|---|---|---|---|---|
| 10,790,005 | B1 * | 9/2020 | He ........................ | G11C 7/24 |
| 11,152,078 | B1 * | 10/2021 | Du ................... | G11C 29/12015 |
| 11,257,535 | B2 * | 2/2022 | Shore .................... | G11C 11/406 |
| 11,270,750 | B2 * | 3/2022 | Ishikawa .......... | G11C 11/40615 |
| 2017/0047110 | A1 * | 2/2017 | Kang .................... | G11C 11/406 |
| 2019/0385667 | A1 * | 12/2019 | Morohashi ........ | G11C 11/40611 |
| 2022/0059153 | A1 * | 2/2022 | Zhang .................. | G11C 11/406 |

(Continued)

FOREIGN PATENT DOCUMENTS

| KR | 10-2017-0108431 A | 9/2017 |
|---|---|---|
| KR | 10-2017-0112786 A | 10/2017 |

OTHER PUBLICATIONS

B. Aichinger, "DDR memory errors caused by Row Hammer," 2015 IEEE High Performance Extreme Computing Conference (HPEC), Waltham, MA, USA, 2015, pp. 1-5, doi: 10.1109/HPEC.2015.7322462. (Year: 2015).*

*Primary Examiner* — Daniel F. McMahon
(74) *Attorney, Agent, or Firm* — IP & T GROUP LLP

(57) ABSTRACT

A memory device may include: a memory bank comprising a first cell mat used as a normal area and a second cell mat used as a row hammer area and a redundancy area; a target address generation circuit suitable for: saving, in the row hammer area, a count of a received address for an active operation on the memory bank by performing an internal access operation on the row hammer area during the active operation, and setting, a particular count which satisfies a preset condition, an address corresponding to the particular count as a target address; a refresh control circuit suitable for controlling a smart refresh operation on the target address; and a column repair circuit suitable for repairing, when a bit line of the normal area has a defect, the bit line of the normal area with a bit line of the redundancy area.

20 Claims, 6 Drawing Sheets

(56) References Cited

U.S. PATENT DOCUMENTS

2022/0068364 A1* 3/2022 Ayyapureddi .... G11C 11/40615
2022/0165347 A1* 5/2022 Pan ..................... G11C 7/065
2022/0189533 A1* 6/2022 Kim ............... G11C 11/40603
2022/0199141 A1* 6/2022 Arai ................. G11C 11/4085

* cited by examiner

MEMORY DEVICE FOR PERFORMING SMART REFRESH OPERATION AND MEMORY SYSTEM INCLUDING THE SAME

CROSS-REFERENCE TO RELATED APPLICATION

This application claims priority under 35 U.S.C. § 119 to Korean Patent Application No. 10-2021-0118434 filed on Sep. 6, 2021, which is incorporated herein by reference in its entirety.

BACKGROUND

1. Field

Various embodiments of the present disclosure relate to a semiconductor circuit, and particularly, to a memory device for performing a smart refresh operation, and a memory system including the same.

2. Discussion of the Related Art

A semiconductor device includes a plurality of memory cells for storing data therein. Each of the memory cells is composed of a cell capacitor and a cell transistor. The semiconductor device stores data through an operation of charging or discharging the cell capacitor, and the amount of charge stored in the cell capacitor needs to be constantly retained at all times. However, the amount of charge stored in the cell capacitor changes due to a voltage difference from a peripheral circuit. As such, when the amount of charge stored in the cell capacitor changes, it indicates that data stored in the cell capacitor is changed. In this case, the stored data may be lost. The semiconductor device performs a refresh operation in order to prevent such a data loss.

Since the development of processing technology has gradually increased the degrees of integration of semiconductor devices, the distance between memory cells shrinks, and the distance between the word lines coupled to the respective memory cells shrinks. When the distance between the word lines shrinks, interference may occur between the adjacent word lines, which makes it difficult to retain data stored in memory cells coupled to the corresponding word lines. That is, the probability that the data will be lost increases.

SUMMARY

Various embodiments of the present disclosure are directed to a memory device which additionally includes a memory area for saving count information of a received address for an active operation, and performs a smart refresh operation of refreshing word lines adjacent to a word line which is most frequently activated, according to the count information, and a memory system including the same.

The technical problems of the present disclosure are not limited to those mentioned above, and the other technical problems which are not mentioned can be clearly understood by a person skilled in the art from the following descriptions.

In an embodiment of the present disclosure, a memory device may include: a memory bank comprising a first cell mat used as a normal area and a second cell mat used as a row hammer area and a redundancy area, each of the areas being an array of memory cells; a target address generation circuit suitable for: saving, in the row hammer area, a count of a received address for an active operation on the memory bank by performing an internal access operation on the row hammer area during the active operation, and setting, a particular count which satisfies a preset condition, an address corresponding to the particular count as a target address; a refresh control circuit suitable for controlling a smart refresh operation on the target address; and a column repair circuit suitable for repairing, when a bit line of the normal area has a defect, the bit line of the normal area with a bit line of the redundancy area.

In an embodiment of the present disclosure, a memory system may include: a memory device comprising a first memory bank including a first cell mat used as a first normal area and a second cell mat used as a row hammer area and a first redundancy area, and a second memory bank including a third cell mat used as a second normal area and a fourth cell mat used as a second redundancy area, each of the areas being an array of memory cells; and a memory controller suitable for storing important data in the first memory bank, and storing normal data in the second memory bank, the normal data having lower reliability than the important data. The memory device may include: a target address generation circuit suitable for saving, in the row hammer area, a count of a received address for an active operation on the first memory bank by performing an internal access operation on the row hammer area during the active operation, and setting, a particular count which satisfies a preset condition, an address corresponding to the particular count as a target address; a refresh control circuit suitable for controlling a smart refresh operation on the target address; and a column repair circuit suitable for repairing, when a bit line of the first normal area has a defect, the bit line of the first normal area with a bit line of the first redundancy area, and repairing, when a bit line of the second normal area has a defect, the bit line of the second normal area with a bit line of the second redundancy area.

In an embodiment of the present disclosure, a memory device may include: a memory bank including first and second cell mats, a row of cells within which share one of word lines, the second cell mat including first and second cell arrays electrically separated from each other with respect to a column; and a control circuit configured to: repair a column of cells within the first cell mats with a column of cells within the first cell array, update a count corresponding to one of the word lines whenever performing an active operation on the cells coupled to the word line, the count being stored in the second cell array, and perform a refresh operation on the cells coupled to one or more of the word lines based on a greatest one of the counts.

In accordance with embodiments of the present disclosure, the memory device and the memory system may additionally include a row hammer area for saving the logic level combinations of all addresses, and perform a smart refresh operation of refreshing word lines adjacent to a word line which is most frequently activated according to results obtained by counting the logic level combinations of all addresses. Through this operation, the memory device and the memory system may accurately count the input counts of all address logic level combinations, and refresh the word line which is most frequently activated and the word lines adjacent thereto, thereby minimizing the interference between the word lines.

Furthermore, when the row hammer area is added to the memory device, the other part of a cell mat including the row hammer area may be used as a redundancy area. Such a configuration may minimize an occurrence of overhead in area due to the addition of the row hammer area.

DETAILED DESCRIPTION

Figure 1:
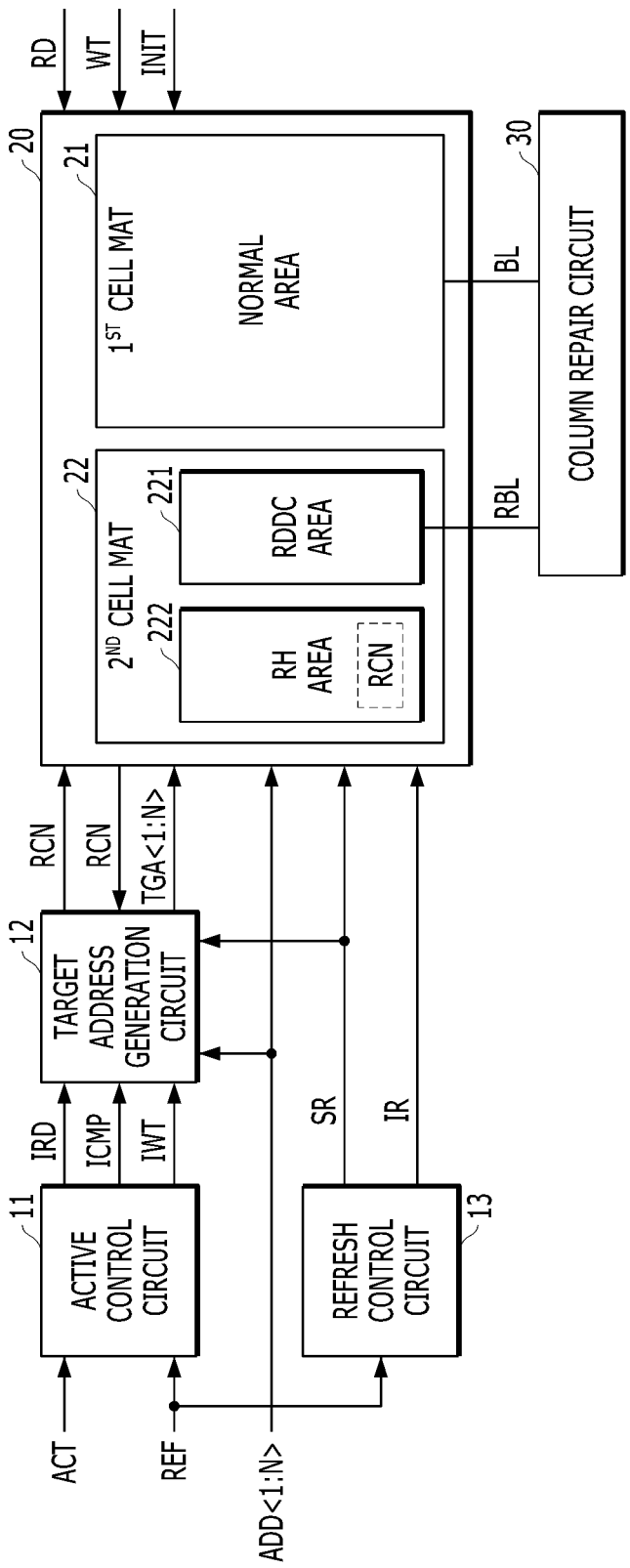
FIG. 1 is a diagram for describing an example of a memory device in accordance with an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a diagram for describing an example of a memory device in accordance with an embodiment of the present disclosure.

Referring to FIG. 1, a memory device 1 in accordance with an embodiment may include an active control circuit 11, a target address generation circuit 12, a refresh control circuit 13 and a memory bank 20. Although not illustrated in the drawing, the memory device 1 may further include a normal operation control circuit.

The memory bank 20 may include a first cell mat 21 and a second cell mat 22.

The first cell mat 21 may be used as a normal area NORMAL AREA for storing normal data therein.

The second cell mat 22 may be used as a row hammer area RH AREA 222 and a redundancy area RDDC AREA 221.

The row hammer area 222 may save information of a count RCN for an address ADD<1:N> inputted to the memory bank 20 for an active operation.

The redundancy area 221 may include an internal bit line RBL which is used in place of a bit line BL of the first cell mat 21 used as the normal area NORMAL AREA, when the bit line BL has a defect.

The active control circuit 11 may receive an active command ACT and a refresh command REF from an external device (for example, memory controller).

The active control circuit 11 may generate an internal read signal IRD, an internal comparison signal ICMP and an internal write signal IWT on the basis of the active command ACT and the refresh command REF.

The active control circuit 11 may generate the internal read signal IRD, the internal comparison signal ICMP and the internal write signal IWT, which are sequentially generated on the basis of the active command ACT.

The active control circuit 11 may generate the internal write signal IWT on the basis of the refresh command REF.

The internal read signal IRD and the internal write signal IWT, which are generated by the active control circuit 11, may not be directly related to a normal read command RD and a normal write command WT, which are generated by a normal operation control circuit.

For example, the normal read command RD and the normal write command WT, which are generated by the normal operation control circuit, may be used to input/output normal data to/from the normal area NORMAL AREA or the redundancy area 221 of the memory bank 20. That is, the normal operation control circuit may input/output normal data by performing an access operation on the normal area NORMAL AREA or the redundancy area 221 of the memory bank 20 during an active operation on the memory bank 20. On the other hand, the internal read signal IRD and the internal write signal IWT, which are generated by the active control circuit 11, may be transferred to the target address generation circuit 12, and used to perform an internal access operation on the row hammer area 222.

The target address generation circuit 12 may save the count RCN of the address ADD<1:N> in the row hammer area 222 included in the second cell mat 22 by performing an internal access operation on the row hammer area 222, during the active operation on the memory bank 20.

When one of entries of the count RCN saved in the row hammer area 222 satisfies a preset condition, the target address generation circuit 12 may set an address corresponding to the count RCN as a target address TGA<1:N>.

The target address generation circuit 12 may receive the internal read signal IRD, the internal comparison signal ICMP and the internal write signal IWT from the active control circuit 11 during an active operation on the memory bank 20.

The target address generation circuit 12 may perform an internal read operation on the row hammer area 222 in response to the internal read signal IRD received from the active control circuit 11.

The target address generation circuit 12 may perform an internal comparison operation in response to the internal comparison signal ICMP received from the active control circuit 11.

The target address generation circuit 12 may perform an internal write operation on the row hammer area 222 in response to the internal write signal IWT received from the active control circuit 11.

The target address generation circuit 12 may receive the address ADD<1:N> from an external device (e.g., memory controller). The address ADD<1:N> may include N bits where N may be a natural number equal to or greater than 2. The row hammer area 222 may store entries of the count RCN corresponding to all word lines WL commonly coupled to the first and second cell mats 21 and 22 (see FIG. 2). In an embodiment, the count RCN for each of the word lines WL may initially have a value of '0' within the row hammer area 222. When receiving the address ADD<1:N> indicating a particular word line of the word lines WL, the target address generation circuit 12 may update the count RCN corresponding to the particular word line among the entries of the count RCN within the row hammer area 222. In this disclosure, the count RCN of the address ADD<1:N> means the count RCN corresponding to the word line indicated by the address ADD<1:N> among the entries of the count RCN, which correspond to all word lines WL and are stored in the row hammer area 222.

The target address generation circuit 12 may update the count RCN of the address ADD<1:N> during the internal read operation, and then save the updated count RCN in the row hammer area 222 during the internal write operation.

In an embodiment, the target address generation circuit 12 may update the count RCN of a first address ADD<1:N> to a value of '3' by counting the number of times that the first address ADD<1:N> is received during the internal read operation, and then save the updated count RCN in the row hammer area 222 during the internal write operation.

In another embodiment, the target address generation circuit 12 may update the count RCN of a second address ADD<1:N> to a value of '7' by counting the number of times that the second address ADD<1:N> is received during the internal read operation, and then save the generated count RCN in the row hammer area 222 during the internal write operation.

The operation of the target address generation circuit 12 to update the count RCN of the address ADD<1:N> during the internal read operation may indicate an operation of reading the count RCN of the address ADD<1:N> from the row hammer area 222 during the internal read operation, and then updating the read count RCN through an up-counting operation. Therefore, the count RCN transferred to the row hammer area 222 from the target address generation circuit 12 during the internal write operation may indicate the count RCN updated by up-counting the count RCN read during the internal read operation. In short, the target address generation circuit 12 may read the count RCN of the address ADD<1:N> from the row hammer area 222 during the internal read operation, update the read count RCN through the up-counting operation, and save the updated count RCN in the row hammer area 222 during the internal write operation.

In an embodiment, in response to the active operation on the first address ADD<1:N>, the target address generation circuit 12 may read a count RCN of '3' of the first address ADD<1:N> from the row hammer area 222 during the internal read operation, and update the read count RCN into a count RCN of '4' of the first address ADD<1:N> through an up-counting operation and save the updated count RCN of the first address ADD<1:N> in the row hammer area 222 during the internal write operation.

In another embodiment, in response to the active operation on the second address ADD<1:N>, the target address generation circuit 12 may read a count RCN of '7' of the second address ADD<1:N> from the row hammer area 222 during the internal read operation, and update the read count RCN into a count RCN of '8' of the second address ADD<1:N> through an up-counting operation and save the updated count RCN of the second address ADD<1:N> in the row hammer area 222 during the internal write operation.

In still another embodiment, even when the count RCN of the initial value '0' is saved for a third address ADD<1:N>, the target address generation circuit 12 may read the count RCN of '0' of the third address ADD<1:N> in response to the active operation on the third address ADD<1:N> during the internal read operation, and update the read count RCN into a count RCN of '1' of the third address ADD<1:N> through an up-counting operation and save the updated count RCN of the third address ADD<1:N> in the row hammer area 222 during the internal write operation.

When the count RCN of a particular address ADD<1:N> satisfies the preset condition among the entries of the count RCN stored in the row hammer area 222, the target address generation circuit 12 may set the particular address ADD<1: N> as the target address TGA<1:N>.

In an embodiment, the target address generation circuit 12 may select the count RCN of the highest count among the entries of the count RCN saved in the row hammer area 222 and then may set, as the target address TGA<1:N>, a particular address ADD<1:N> indicating a word line corresponding to the count RCN of the highest count among the entries of the count RCN saved in the row hammer area 222.

The target address generation circuit 12 may perform an operation of selecting a count satisfying the preset condition among the entries of the count RCN saved in the row hammer area 222 in a period where the internal comparison operation is performed in response to the internal comparison signal ICMP received from the active control circuit 11.

The target address generation circuit 12 may output the target address TGA<1:N> therefrom to the memory bank 20 in response to a smart refresh signal SR received from the refresh control circuit 13. That is, when the refresh control circuit 13 generates the smart refresh signal SR to perform the smart refresh operation on the memory bank 20, the target address generation circuit 12 may output the target address TGA<1:N> to the memory bank 20 to perform the smart refresh operation on one or more word lines based on the target address TGA<1:N>.

The smart refresh operation may indicate an operation of refreshing one or more word lines adjacent to a word line corresponding to the target address TGA<1:N> among a plurality of word lines WL1, WL2, WL3, . . . included in the memory bank 20. In an embodiment, when the word line corresponding to the target address TGA<1:N> is a $J^{th}$ word line among the plurality of word lines WL1, WL2, WL3, . . . included in the memory bank 20, not only the $J^{th}$ word line but also a $(J+1)^{th}$ word line and a $(J-1)^{th}$ word line, which are adjacent to the $J^{th}$ word line, may be selected and refreshed during the smart refresh operation on the target address TGA<1:N>. Here, J is a natural number equal to or greater than 1.

The target address generation circuit 12 may perform the internal write operation after the smart refresh operation is performed, thereby resetting the count corresponding to the target address TGA<1:N> among the entries of the count RCN saved in the row hammer area 222.

The refresh control circuit 13 may receive the refresh command REF from an external device (e.g., a memory controller).

The refresh control circuit 13 may generate the smart refresh signal SR and an internal refresh signal IR on the basis of the refresh command REF.

The refresh control circuit 13 may generate the smart refresh signal SR which is enabled when the refresh command REF is inputted in a form corresponding to a condition for performing the smart refresh operation. The refresh control circuit 13 may generate the smart refresh signal SR and transfer the generated smart refresh signal SR to the memory bank 20 and the target address generation circuit 12, thereby controlling the smart refresh operation on the target address TGA<1:N>.

The refresh control circuit 13 may generate the internal refresh signal IR which is enabled when the refresh command REF is inputted in a form corresponding to a condition for performing a self refresh operation. The refresh control circuit 13 may generate the internal refresh signal IR to perform the self refresh operation.

A column repair circuit 30 may repair a bit line BL of the normal area NORMAL AREA with a bit line RBL of the redundancy area 221, when the bit line BL has a defect.

In an embodiment, when a defect occurs in a first bit line included in the normal area NORMAL AREA, the column repair circuit 30 may repair the first bit line with a second bit line included in the redundancy area 221. In such a case, when a column address for accessing the first bit line is inputted, the column repair circuit 30 may block an access to the first bit line, such that the second bit line is accessed instead of the first bit line.

The row hammer area 222 may initialize all entries of the count RCN saved therein in response to an initialization signal INIT which is inputted during a power-up period and boot-up period in which the memory device 1 starts to operate. The bits of the initialized count RCN may all have a logic low level of '0'.

For reference, the count RCN described in the above embodiment may include a predefined number of bits. In an embodiment, the count RCN may include six bits.

Figure 2:
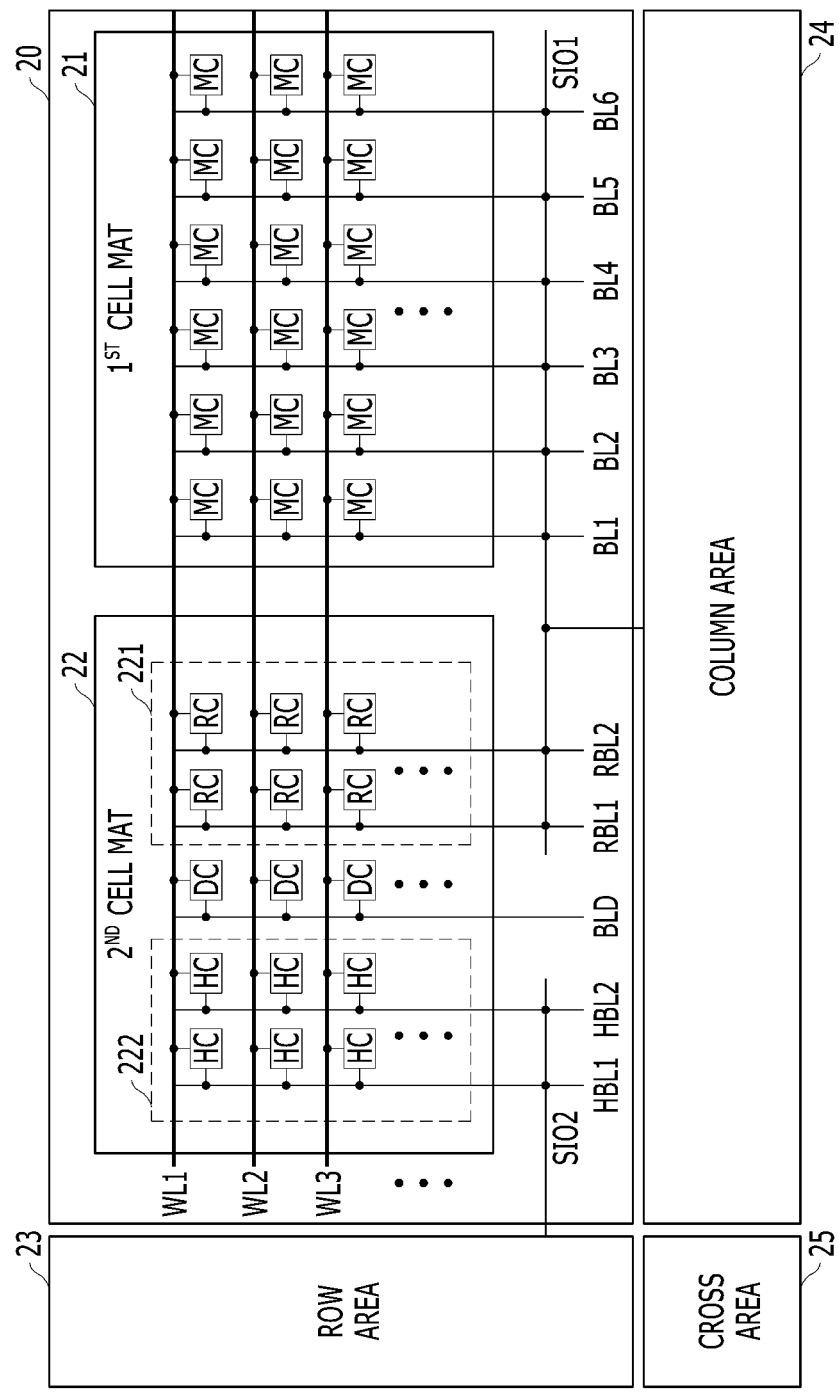
FIG. 2 is a diagram for describing an example of a memory bank among components of the memory device disclosed in FIG. 1 in accordance with an embodiment of the present disclosure.

FIG. 2 is a diagram for describing an example of the memory bank among the components of the memory device disclosed in FIG. 1 in accordance with an embodiment of the present disclosure.

Referring to FIG. 2, the memory bank 20 may include the first cell mat 21 and the second cell mat 22.

Although not illustrated in detail in FIG. 1, a row area ROW AREA 23 may be located on any side of the right and left sides of the memory bank 20 in FIG. 2. FIG. 2 shows that the row area 23 is located on the left side of the memory bank 20. Furthermore, a column area 24 may be located on any side of the top and bottom sides of the memory bank 20. FIG. 2 shows that the column area 24 is located on the bottom side of the memory bank 20. Furthermore, a cross area 25 may be located between the row area 23 and the column area 24.

Between the cell mats 21 and 22 included in the memory bank 20, the second cell mat 22 may be located closer to the row area 23 than the first cell mat 21. When the row area 23 is located on the left side of the memory bank 20 as illustrated in FIG. 2, the second cell mat 22 may be located on the left side and the first cell mat 21 may be located on the right side, in the memory bank 20. When the row area 23 is located on the right side of the memory bank 20 unlike the configuration illustrated in FIG. 2, the second cell mat 22 may be located on the right side and the first cell mat 21 may be located on the left side, in the memory bank 20.

The memory bank 20 may include a plurality of memory cells HC, DC, RC and MC coupled between the plurality of word lines WL1, WL2, WL3 . . . and a plurality of bit lines BL1, BL2, BL3, BL4, BL5, BL6, HBL, BLD and RBL.

The first and second cell mats 21 and 22 included in the memory bank 20 may share the plurality of word lines WL1, WL2, WL3, . . . which are driven at the same time. For example, although not illustrated in the drawing, the plurality of word lines WL1, WL2, WL3, . . . may be simultaneously driven by word line drivers located in the row area 23.

In an embodiment, the case in which the first and second cell mats 21 and 22 share the plurality of word lines WL1, WL2, WL3, . . . and the plurality of word lines WL1, WL2, WL3, . . . are driven at the same time is taken as an example. However, this is only an example, and a plurality of word lines corresponding to the first cell mat 21 and a plurality of word lines corresponding to the second cell mat 22 may be independently driven. For example, although not illustrated in the drawing, sub word line drivers may be further included between the first and second cell mats 21 and 22. Through the sub world line drivers, the plurality of word lines corresponding to the first cell mat 21 and the plurality of word lines corresponding to the second cell mat 22 may be shared and driven, or independently driven.

The plurality of bit lines BL1, BL2, BL3, BL4, BL5 and BL6 corresponding to the first cell mat 21 and the plurality of bit lines HBL and RBL corresponding to the second cell mat 22 may be physically isolated from each other.

First memory cells HC coupled between the first bit line HBL of the plurality of bit lines HBL and RBL included in the second cell mat 22 and the plurality of word lines WL1, WL2, WL3, . . . may be used as the row hammer area 222. Second memory cells RC coupled between the second bit line RBL of the plurality of bit lines HBL and RBL included in the second cell mat 22 and the plurality of word lines WL1, WL2, WL3, . . . may be used as the redundancy area 221.

Among the plurality of bit lines HBL and RBL included in the second cell mat 22, the first bit line HBL corresponding to the row hammer area 222 may be located closer to the row area 23 than the second bit line RBL corresponding to the redundancy area 221. As illustrated in FIG. 2, when the row area 23 is located on the left side of the memory bank 20 such that the second cell mat 22 is located on the left side and the first cell mat 21 is located on the right side, in the memory bank 20, the first bit line HBL may be located on the left side and the second bit line RBL may be located on the right side, in the second cell mat 22. Unlike the configuration illustrated in FIG. 2, when the row area 23 is located on the right side of the memory bank 20 such that the second cell mat 22 is located on the right side and the first cell mat 21 is located on the left side, in the memory bank 20, the first bit line HBL may be located on the right side and the second bit line RBL may be located on the left side, in the second cell mat 22.

The second bit line RBL and the bit lines BL1, BL2, BL3, BL4, BL5 and BL6 corresponding to the first cell mat 21 may be coupled to the column area 24 through a first segment line SIO1. Since the first cell mat 21 is used as the normal area NORMAL AREA and the second bit line RBL corresponds to the redundancy area 221 included in the first cell mat 21, the bit lines BL1, BL2, BL3, BL4, BL5 and BL6 corresponding to the normal area and the second bit line RBL corresponding to the redundancy area 221 may be coupled to the column area 24 through the first segment line SIO1.

The first bit line HBL may be coupled to the row area 23 through a second segment line SIO2 which is physically isolated from the first segment line SIO1. That is, the second bit line RBL corresponding to the redundancy area 221 and the first bit line HBL corresponding to the row hammer area 222 may transmit data through the transmission paths SIO1 and SIO2 which are physically isolated from each other. In particular, since the first segment line SIO1 is coupled to the column area 24 and the second segment line SIO2 is coupled to the row area 23, data loaded on the respective lines SIO1 and SIO2 may be processed through totally different circuits.

The plurality of bit lines HBL and RBL included in the second cell mat 22 may include a bit line BLD which does not correspond to the row hammer area 222 and the redundancy area 221. That is, the plurality of bit lines HBL and RBL included in the second cell mat 22 may include a third bit line BLD located between the first and second bit lines HBL and RBL. Memory cells DC coupled between the third bit line BLD and the plurality of word lines WL1, WL2, WL3, . . . may not be used for any purpose. Therefore, the third bit line BLD may not be physically coupled to each of the first and second segment lines SIO1 and SIO2. That is, the third bit line BLD may not be coupled to the column area 24 or the row area 23.

Although not illustrated in the drawing, the column area 24 may include a data input/output circuit configured to output data, transferred through the first segment line SIO1, to the outside (e.g., memory controller) of the memory device 1 or transfer data, received from the outside of the memory device 1, to the first segment line SIO1.

The column repair circuit 30 disclosed in FIG. 1 may be located in the column area 24 or located in both the column area 24 and the cross area 25. The target address generation circuit 12, the refresh control circuit 13 and the active control circuit 11, which are disclosed in FIG. 1, may be located in the row area 23 or located in both the row area 23 and the cross area 25.

When the internal read operation is performed in response to the internal read signal IRD generated by the active control circuit 11, the target address generation circuit 12 may read, through the second segment line SIO2, the count RCN of the address ADD<1:N> from the first memory cells HC coupled between the plurality of word lines WL1, WL2, WL3, . . . and the first bit line HBL corresponding to the row hammer area 222.

When the internal write operation is performed in response to the internal write signal IWT generated by the active control circuit 11, the target address generation circuit 12 may update the count RCN, which is read through the internal read operation, through an up-counting operation. Then, the target address generation circuit 12 may write the updated count RCN to the first memory cells HC coupled between the plurality of word lines WL1, WL2, WL3, . . . and the first bit line HBL corresponding to the row hammer area 222 through the second segment line SIO2.

When a normal read operation is performed in response to the normal read command RD generated by the normal operation control circuit, first data may be read from a memory cell selected among normal memory cells MC coupled between the plurality of word lines WL1, WL2, WL3, . . . and the plurality of bit lines BL1, BL2, BL3, BL4, BL5 and BL6 corresponding to the normal area NORMAL AREA or a memory cell selected among the second memory cells RC coupled between the plurality of word lines WL1, WL2, WL3, . . . and the second bit line RBL corresponding to the redundancy area 221, and transferred to a data output circuit included in the column area 24 through the first segment line SIO1.

When a normal write operation is performed in response to the normal write command WD generated by the normal operation control circuit, second data received through the first segment line SIO1 from a data input circuit included in the column area 24 may be written to a memory cell selected among the normal memory cells MC coupled between the plurality of word lines WL1, WL2, WL3, . . . and the plurality of bit lines BL1, BL2, BL3, BL4, BL5 and BL6 corresponding to the normal area NORMAL AREA or a memory cell selected among the second memory cells RC coupled between the plurality of word lines WL1, WL2, WL3, . . . and the second bit line RBL corresponding to the redundancy area 221.

Figure 3:
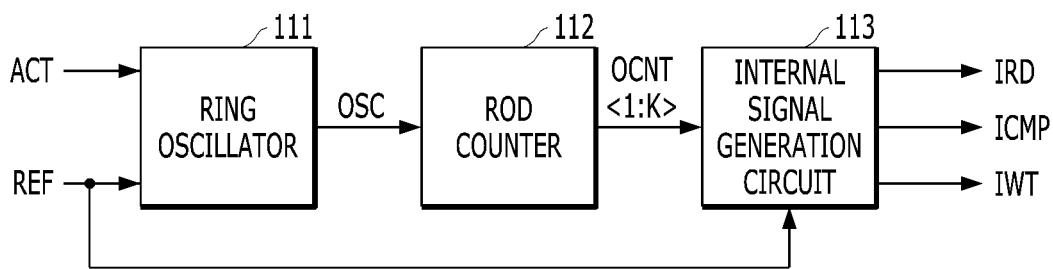
FIG. 3 is a diagram for describing an example of an active control circuit among the components of the memory device disclosed in FIG. 1 in accordance with an embodiment of the present disclosure.

FIG. 3 is a diagram for describing an example of the active control circuit among the components of the memory device disclosed in FIG. 1 in accordance with an embodiment of the present disclosure.

Referring to FIG. 3, the active control circuit 11 may include a ring oscillator 111, an ROD counter 112 and an internal signal generation circuit 113.

The ring oscillator 111 may generate an oscillation signal OSC which toggles on the basis of the active command ACT and the refresh command REF. The ring oscillator 111 may generate the oscillation signal OSC which periodically toggles when the active command ACT is inputted. The ring oscillator 111 may generate the oscillation signal OSC which periodically toggles when the refresh command REF is inputted.

The ROD counter 112 may generate an oscillation counting signal OCNT<1:K> which is counted on the basis of the oscillation signal OSC. The ROD counter 112 may generate the oscillation counting signal OCNT<1:K> which is counted whenever a pulse of the oscillation signal OSC is inputted. The oscillation counting signal OCNT<1:K> may include K bits where K is a natural number equal to or greater than 2.

The internal signal generation circuit 113 may generate the internal read signal IRD, the internal comparison signal ICMP and the internal write signal IWT which are sequentially enabled on the basis of the refresh command REF and the counting value of the oscillating counting signal OCNT<1:K>. The internal signal generation circuit 113 may generate the internal read signal IRD when the oscillation counting signal OCNT<1:K> has a first counting value. The internal signal generation circuit 113 may generate the internal comparison signal ICMP when the oscillation counting signal OCNT<1:K> has a second counting value. The internal signal generation circuit 113 may generate the internal write signal IWT when the oscillation counting signal OCNT<1:K> has a third counting value. The internal signal generation circuit 113 may generate the internal write signal IWT when the refresh command REF is inputted and the oscillation counting signal OCNT<1:K> has the third counting value. The second counting value may indicate a value larger than the first counting value. The third counting value may indicate a value larger than the second counting value.

Figure 4:
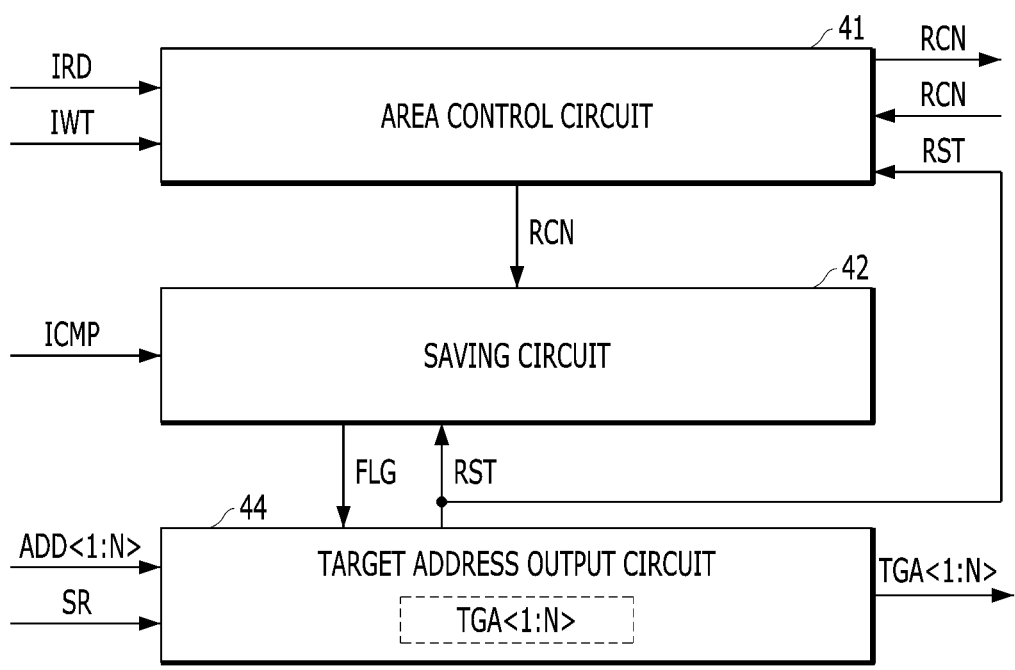
FIG. 4 is a diagram for describing an example of a target address generation circuit among the components of the memory device disclosed in FIG. 1 in accordance with an embodiment of the present disclosure.

FIG. 4 is a diagram for describing an example of the target address generation circuit among the components of the memory device disclosed in FIG. 1 in accordance with an embodiment of the present disclosure.

Referring to FIG. 4, the target address generation circuit 12 may include an area control circuit 41, a saving circuit 42 and a target address output circuit 44.

During an active operation on the memory bank 20, the area control circuit 41 may read, from the row hammer area 222, a count RCN corresponding to a word line indicated by the externally provided address ADD<1:N> among entries of the count RCN corresponding to all word lines WL commonly coupled to the first and second cell mats 21 and 22 by performing an internal read operation on the row hammer area 222, update the read count RCN through an up-counting operation, and then save the updated count RCN in the row hammer area 222 by performing an internal write operation on the row hammer area 222.

The area control circuit 41 may read, from the row hammer area 222, the count RCN corresponding to a word line indicated by the externally provided address ADD<1:N> among entries of the count RCN corresponding to all word lines WL commonly coupled to the first and second cell mats 21 and 22 by performing the internal read operation on the row hammer area 222 in response to the internal read signal IRD received from the active control circuit 11. The externally provided address ADD<1:N> may indicate one of all word lines WL commonly coupled to the first and second cell mats 21 and 22. The address ADD<1:N> may be inputted to memory bank 20 in order to select one of all word lines WL commonly coupled to the first and second cell mats 21 and 22.

Therefore, the area control circuit 41 may perform the internal read operation of reading the count RCN saved in the first memory cell HC coupled between the first bit line HBL and any word line of the plurality of word lines WL1, WL2, WL3, . . . included in the row hammer area 222, in response to the internal read signal IRD received from the active control circuit 11.

When the internal read operation is performed in response to the internal read signal IRD generated by the active control circuit 11, the area control circuit 41 may read, from the row hammer area 222 and through the second segment line SIO2, the count RCN saved in the first memory cell HC coupled between the word line indicated by the address ADD<1:N> among the plurality of word lines WL1, WL2, WL3, . . . and the first bit line HBL corresponding to the row hammer area 222.

The area control circuit 41 may update the count RCN, which is read through the internal read operation and corresponds to a word line indicated by the address ADD<1:N>, through an up-counting operation.

The area control circuit 41 may save, in the row hammer area 222, the updated count RCN corresponding to the word line indicated by the address ADD<1:N> by performing the internal write operation on the row hammer area 222 in response to the internal write signal IWT received from the active control circuit 11.

When an internal write operation is performed in response to the internal write signal IWT generated by the active control circuit 11, the area control circuit 41 may update the count RCN corresponding to a word line indicated by the address ADD<1:N>, through an up-counting operation. Then, the area control circuit 41 may write, through the second segment line SIO2, the updated count RCN to the first memory cell HC coupled between a word line indicated by the address ADD<1:N> among the plurality of word lines WL1, WL2, WL3, . . . and the first bit line HBL corresponding to the row hammer area 222.

The area control circuit 41 may reset the count RCN saved in the first memory cell HC coupled between the word line corresponding to 'the input address' among the plurality of word lines WL1, WL2, WL3, . . . and the first bit line HBL coupled to the row hammer area 222, in response to a reset signal RST. The bits of the reset count RCN may all have a logic low level of '0'.

The saving circuit 42 may store therein a candidate count SELN. When the count RCN updated by the area control circuit 41 through the up-counting operation satisfies a preset condition, the saving circuit 42 may save the updated count RCN, which satisfies the present condition, as the candidate count SELN therein. The saving circuit 42 may reset the candidate count SELN therein in response to the reset signal RST.

During an active operation on the memory bank 20, when the updated count RCN generated by the area control circuit 41 is greater than the candidate count SELN currently stored in the saving circuit 42, the saving circuit 42 may update the current candidate count SELN to the updated count RCN greater than the current candidate count SELN and may generate a flag signal FLG. The saving circuit 42 may reset the candidate count SELN in response to the reset signal RST.

The saving circuit 42 may compare the value of the updated count RCN generated by the area control circuit 41 to the value of the candidate count SELN currently stored therein, in response to the internal comparison signal ICMP received from the active control circuit 11. When the comparison result indicates that the value of the updated count RCN generated by the area control circuit 41 is greater than the value of the current candidate count SELN, the saving circuit 42 may update the current candidate count SELN to the updated count RCN greater than the current candidate count SELN. When the comparison result indicates that the value of the updated count RCN generated by the area control circuit 41 is less than the value of the candidate count SELN, the saving circuit 42 may retain the current candidate count SELN. Therefore, the candidate count SELN may be kept to have the highest count among all entries of the count RCN saved in the row hammer area 222.

The saving circuit 42 may reset the candidate count SELN included therein in response to the reset signal RST. In an embodiment, the bits of the reset candidate count SELN may all have a logic low level of '0'.

The saving circuit 42 may generate the flag signal FLG when the value of the updated count RCN generated by the area control circuit 41 is greater than the value of the candidate count SELN currently stored therein. The saving circuit 42 may not generate the flag signal FLG when the value of the updated count RCN generated by the area control circuit 41 is less than the value of the candidate count SELN currently stored therein.

The target address output circuit 44 may save the address ADD<1:N> as the target address TGA<1:N> in response to the flag signal FLG generated by the saving circuit 42. The target address output circuit 44 may output the target address TGA<1:N> to the memory bank 20 during a smart refresh operation. The target address output circuit 44 may generate the reset signal RST after the smart refresh operation is performed.

When the flag signal FLG is generated by the saving circuit 42, it may indicate that the candidate count SELN is updated to the updated count RCN generated by the area control circuit 41. Therefore, a word line indicated by the address ADD<1:N> at the point in time that the flag signal FLG is generated may correspond to the highest count among all entries of the count RCN which have been saved in the row hammer area 222 until the corresponding point in time. Therefore, the target address TGA<1:N> saved in the target address output circuit 44 may be the address corresponding to the highest count among all entries of the count RCN saved in the row hammer area 222.

The target address output circuit 44 may output the target address TGA<1:N> therefrom to the memory bank 20 in response to the smart refresh signal SR received from the refresh control circuit 13 and corresponding to the smart refresh operation. Therefore, the refresh control circuit 13 may generate the smart refresh signal SR and transfer the generated smart refresh signal SR to the memory bank 20 and the target address generation circuit 12, such that the smart refresh operation can be performed on the target address TGA<1:N> corresponding to the highest count among all entries of the count RCN saved in the row hammer area 222.

The target address output circuit 44 may generate the reset signal RST after the smart refresh operation is performed. The target address output circuit 44 may generate the reset signal RST which is enabled when the smart refresh operation is completed after the smart refresh signal SR corresponding to the smart refresh operation is received from the refresh control circuit 13.

The area control circuit 41 may reset the count RCN saved in the first memory cell HC coupled between the word line corresponding to 'the input address' among the plurality of word lines WL1, WL2, WL3, . . . and the first bit line HBL corresponding to the row hammer area 222, in response to the reset signal RST. The bits of the reset count RCN may all have a logic low level of '0'.

Figure 5:
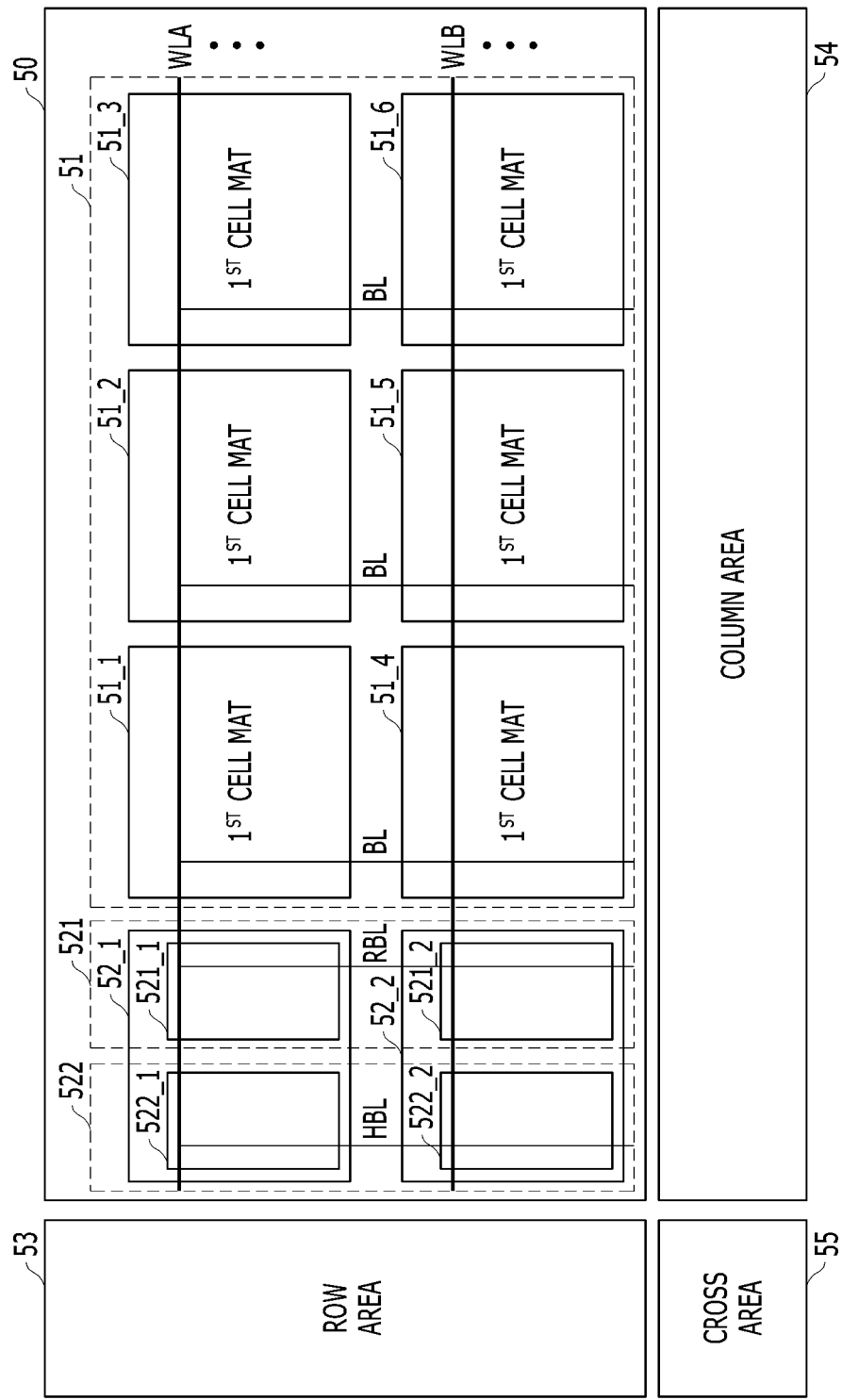
FIG. 5 is a diagram for describing another example of the memory bank among the components of the memory device disclosed in FIG. 1 in accordance with an embodiment of the present disclosure.

FIG. 5 is a diagram for describing another example of the memory bank among the components of the memory device disclosed in FIG. 1 in accordance with an embodiment of the present disclosure.

FIG. 5 shows that a memory bank 50 includes eight cell mats 51_1, 51_2, 51_3, 51_4, 51_5, 51_6, 52_1 and 52_2, for example.

In the memory device 1 in accordance with the embodiment disclosed in FIGS. 1 and 2, the memory bank 20 includes two cell mats 21 and 22, for example. FIG. 5 shows how the characteristic configuration of the present embodiment is applied, when the memory bank 50 includes a larger number of cell mats 51_1, 51_2, 51_3, 51_4, 51_5, 51_6, 52_1 and 52_2. Therefore, the following descriptions will be focused on differences between the two embodiments.

First, a row area ROW AREA 53 may be located on one side of the right and left sides of the memory bank 50, as in FIG. 2. FIG. 5 shows that the row area 53 is located on the left side of the memory bank 50. Furthermore, a column area COLUMN AREA 54 may be located on one side of the top and bottom sides of the memory bank 50. FIG. 5 shows that the column area 54 is located on the bottom side of the memory bank 50. Furthermore, a cross area CROSS AREA 55 may be located between the row area 53 and the column area 54.

Referring to FIG. 5, six first cell mats 51_1, 51_2, 51_3, 51_4, 51_5 and 51_6 among the eight cell mats 51_1, 51_2, 51_3, 51_4, 51_5, 51_6, 52_1 and 52_2 included in the memory bank 50 may be used as a normal area 51 for storing normal data therein.

Among the eight cell mats 51_1, 51_2, 51_3, 51_4, 51_5, 51_6, 52_1 and 52_2 included in the memory bank 50, two second cell mats 52_1 and 52_2 may be used as a row hammer area 522 and a redundancy area 521.

Among the eight cell mats 51_1, 51_2, 51_3, 51_4, 51_5, 51_6, 52_1 and 52_2 included in the memory bank 50, three first cell mats 51_1, 51_2 and 51_3 and one second cell mat 52_1, which are located at the top, may share a plurality of word lines WLA, . . . which are driven at the same time.

Among the eight cell mats 51_1, 51_2, 51_3, 51_4, 51_5, 51_6, 52_1 and 52_2 included in the memory bank 50, three first cell mats 51_4, 51_5 and 51_6 and one second cell mat 52_2, which are located at the bottom, may share a plurality of word lines WLB, . . . which are driven at the same time.

Among the eight cell mats 51_1, 51_2, 51_3, 51_4, 51_5, 51_6, 52_1 and 52_2 included in the memory bank 50, the three first cell mats 51_1, 51_2 and 51_3 and the one second cell mat 52_1, which are located at the top, and the three first cell mats 51_4, 51_5 and 51_6 and the one second cell mat 52_2, which are located at the bottom, may share different word lines WLA, . . . and WLB, . . . , respectively. Therefore, when an address ADD<1:N> is inputted from the outside (e.g. memory controller), one of the word lines WLA, . . . corresponding to the three first cell mats 51_1, 51_2 and 51_3 and the one second cell mat 52_1, which are located at the top, may be activated, or one of the word lines WLB, . . . corresponding to the three first cell mats 51_4, 51_5 and 51_6 and the one second cell mat 52_2, which are located at the bottom, may be activated.

The one second cell mat 52_1 located at the top and the one second cell mat 52_2 located at the bottom may share a plurality of bit lines HBL and RBL. The three first cell mats 51_1, 51_2 and 51_3 located at the top and the three first cell mats 51_4, 51_5 and 51_6 located at the bottom may share a plurality of bit lines BL.

Among the cell mats 51_1, 51_2, 51_3, 51_4, 51_5, 51_6, 52_1 and 52_2 included in the memory bank 50, the second cell mats 52_1 and 52_2 may be located closer to the row area 53 than the first cell mats 51_1, 51_2, 51_3, 51_4, 51_5 and 51_6. When the row area 53 is located on the left side of the memory bank 50 as illustrated in FIG. 5, the second cell mats 52_1 and 52_2 may be located on the left side and the first cell mats 51_1, 51_2, 51_3, 51_4, 51_5 and 51_6 may be located on the right side, in the memory bank 50. When the row area 53 is located on the right side of the memory bank 50 unlike the configuration illustrated in FIG. 5, the second cell mats 52_1 and 52_2 may be located on the right side and the first cell mats 51_1, 51_2, 51_3, 51_4, 51_5 and 51_6 may be located on the left side, in the memory bank 50.

Among the three first cell mats 51_1, 51_2 and 51_3 and the one second cell mat 52_1, which are located at the top, the one second cell mat 52_1 may be located closer to the row area 53 than the three first cell mats 51_1, 51_2 and 51_3.

Among the three first cell mats 51_4, 51_5 and 51_6 and the one second cell mat 52_2, which are located at the bottom, the one second cell mat 52_2 may be located closer to the row area 53 than the three first cell mats 51_4, 51_5 and 51_6.

In the present embodiment, the case in which the first cell mats 51_1, 51_2, 51_3, 51_4, 51_5 and 51_6 and the second cell mats 52_1 and 52_2 share the plurality of word lines WLA, . . . and WLB, . . . and the plurality of word lines WLA, . . . and WLB, . . . are driven at the same time has been taken as an example. However, this is only an embodiment, and a plurality of word lines corresponding to the first cell mats 51_1, 51_2, 51_3, 51_4, 51_5 and 51_6, respectively, and a plurality of word lines corresponding to the second cell mats 52_1 and 52_2, respectively, may be independently driven. For example, although not illustrated in the drawing, sub word line drivers may be further included between the first cell mats 51_1, 51_2, 51_3, 51_4, 51_5 and 51_6 and the second cell mats 52_1 and 52_2, respectively. Through the sub word line drivers, the plurality of word lines corresponding to the first cell mats 51_1, 51_2, 51_3, 51_4, 51_5 and 51_6, respectively, and the plurality of word lines corresponding to the second cell mats 52_1 and 52_2, respectively, may be shared and driven or independently driven.

The plurality of bit lines BL corresponding to the first cell mats 51_1, 51_2, 51_3, 51_4, 51_5 and 51_6 and the plurality of bit lines HBL and RBL corresponding to the second cell mats 52_1 and 52_2 may be physically isolated from each other.

First memory cells coupled between the first bit line HBL of the plurality of bit lines HBL and RBL included in the second cell mats 52_1 and 52_2 and the plurality of word lines WLA, . . . /WLB, . . . may be used as the row hammer area 522.

Second memory cells coupled between the second bit line RBL of the plurality of bit lines HBL and RBL included in the second cell mats 52_1 and 52_2 and the plurality of word lines WLA, . . . /WLB, . . . may be used as the redundancy area 521.

Among the plurality of bit lines HBL and RBL included in the second cell mats 52_1 and 52_2, the first bit line HBL corresponding to the row hammer area 522 may be located closer to the row area 53 than the second bit line RBL corresponding to the redundancy area 521. As illustrated in FIG. 5, when the row area 53 is located on the left side of the memory bank 50 such that the second cell mats 52_1 and 52_2 are located on the left side and the first cell mats 51_1, 51_2, 51_3, 51_4, 51_5 and 51_6 are located on the right side, in the memory bank 50, the first bit line HBL may be located on the left side and the second bit line RBL may be located on the right side, in each of the second cell mats 52_1 and 52_2. Unlike the configuration illustrated in FIG. 5, when the row area 53 is located on the right side of the memory bank 50 such that the second cell mats 52_1 and 52_2 are located on the right side and the first cell mats 51_1, 51_2, 51_3, 51_4, 51_5 and 51_6 are located on the left side, in the memory bank 50, the first bit line HBL may be located on the right side and the second bit line RBL may be located on the left side, in each of the second cell mats 52_1 and 52_2.

Among the plurality of bit lines HBL and RBL included in the second cell mat 52_1 located at the top, the first bit line HBL corresponding to a row hammer area 522_1 may be located closer to the row area 53 than the second bit line RBL corresponding to a redundancy area 521_1.

Among the plurality of bit lines HBL and RBL included in the second cell mat 52_2 located at the bottom, the first bit line HBL corresponding to a row hammer area 522_2 may be located closer to the row area 53 than the second bit line RBL corresponding to a redundancy area 521_2.

The entries of the count RCN corresponding to the plurality of word lines WLA, shared by the cells mats 51_1, 51_2, 51_3 and 52_1 located at the top may be saved in the row hammer area 522_1 included in the second cell mat 52_1 located at the top.

The entries of the count RCN corresponding to the plurality of word lines WLB, shared by the cells mats 51_4, 51_5, 51_6 and 52_2 located at the bottom may be saved in the row hammer area 522_2 included in the second cell mat 52_2 located at the bottom.

Figure 6:
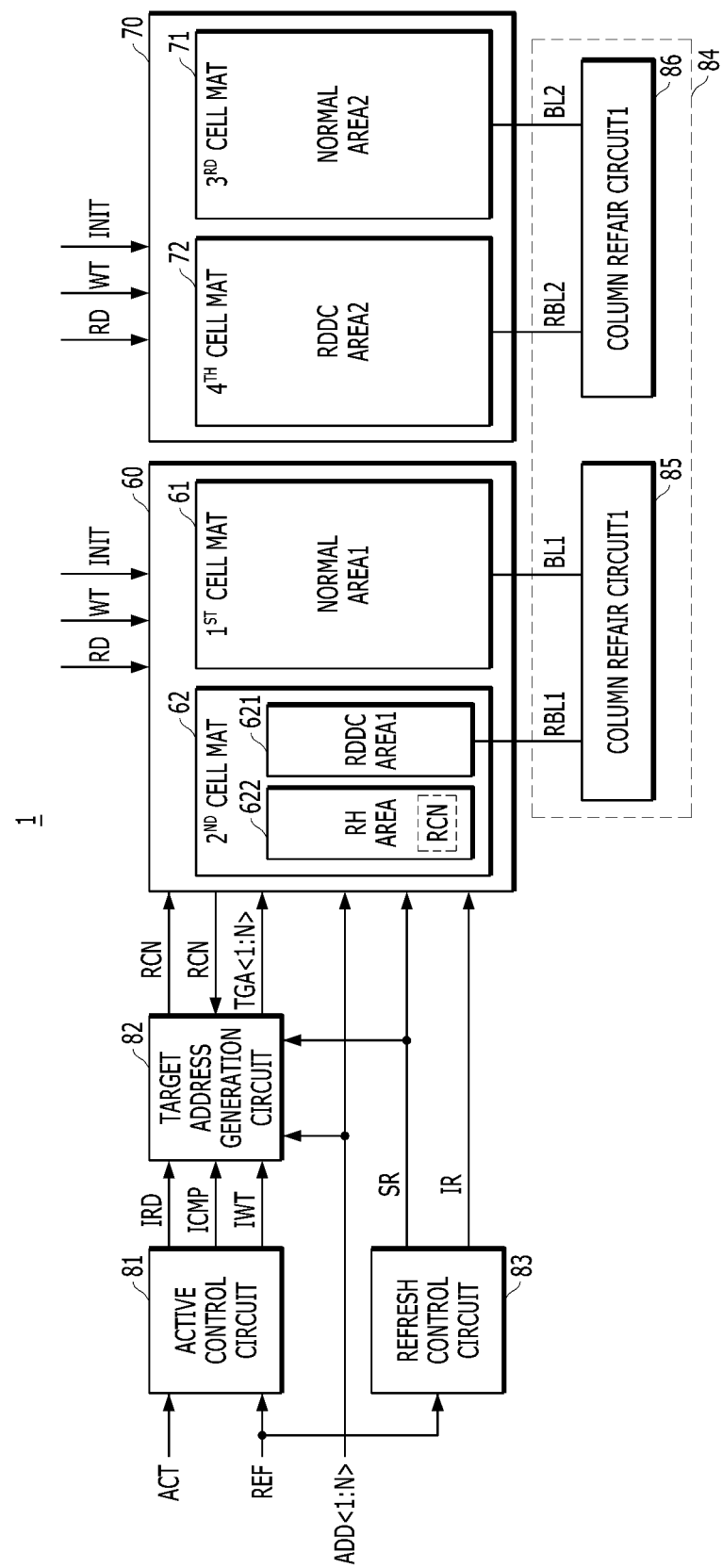
FIG. 6 is a diagram for describing an example of a memory device in accordance with another embodiment of the present disclosure.

FIG. 6 is a diagram for describing an example of a memory device in accordance with an embodiment of the present disclosure.

Referring to FIG. 6, a memory device 1 in accordance with an embodiment may include a first memory bank 60, a second memory bank 70, an active control circuit 81, a target address generation circuit 82, a refresh control circuit 83 and a column repair circuit 84. The column repair circuit 84 may include a first column repair circuit 85 and a second column repair circuit 86.

The first memory bank 60 may include a first cell mat 61 and a second cell mat 62.

The second memory bank 70 may include a third cell mat 71 and a fourth cell mat 72.

The first cell mat 61 may be used as a first normal area NORMAL AREA1 for storing normal data therein.

The second cell mat 62 may be used as a row hammer area RH AREA 622 and a first redundancy area RDDC AREA 621.

The third cell mat 71 may be used as a second normal area NORMAL AREA2 for storing normal data therein.

The fourth cell mat 72 may be used as a second redundancy area RDDC AREA2.

The row hammer area 622 may save the count RCN of an address ADD<1:N> inputted to the first memory bank 60.

The first redundancy area 621 may include an internal bit line RBL1 which is used in place of a bit line BL1 of the first cell mat 61 used as the first normal area NORMAL AREA1, when the bit line BL1 has a defect.

The second redundancy area 72 may include an internal bit line RBL2 which is used in place of a bit line BL2 of the third cell mat 71 used as the second normal area NORMAL AREA2, when the bit line BL2 has a defect.

While the memory device 1 disclosed in FIG. 1 includes one memory bank 20, the memory device 1 disclosed in FIG. 6 may include two memory banks 60 and 70.

In particular, a first memory bank 60 of two memory banks 60 and 70 included in the memory device 1 disclosed in FIG. 6 may have the same configuration as the one memory bank 20 included in the memory device 1 disclosed in FIG. 1. That is, the first memory bank 60 included in the memory device 1 disclosed in FIG. 6 may perform the same operation as the one memory bank 20 included in the memory device 1 disclosed in FIG. 1. Therefore, the detailed descriptions of the operations of the first memory bank 60, the active control circuit 81, the target address generation circuit 82 and the refresh control circuit 83, which are included in the memory device 1 disclosed in FIG. 6, may be replaced with those described with the reference to FIGS. 1 and 2.

However, the second memory bank 70 of the two memory banks 60 and 70 included in the memory device 1 disclosed in FIG. 6 is a memory bank having a configuration which is not included in the memory device 1 disclosed in FIG. 1.

The second memory bank 70 included in the memory device 1 disclosed in FIG. 6 may be used only to store normal data. However, the first memory bank 60 may store normal data in the first normal area NORMAL AREA1 61 or the first redundancy area RDDC AREA1 621, and save, in the row hammer area 622, the count RCN of the address ADD<1:N> inputted to the first memory bank 60.

Figure 7:
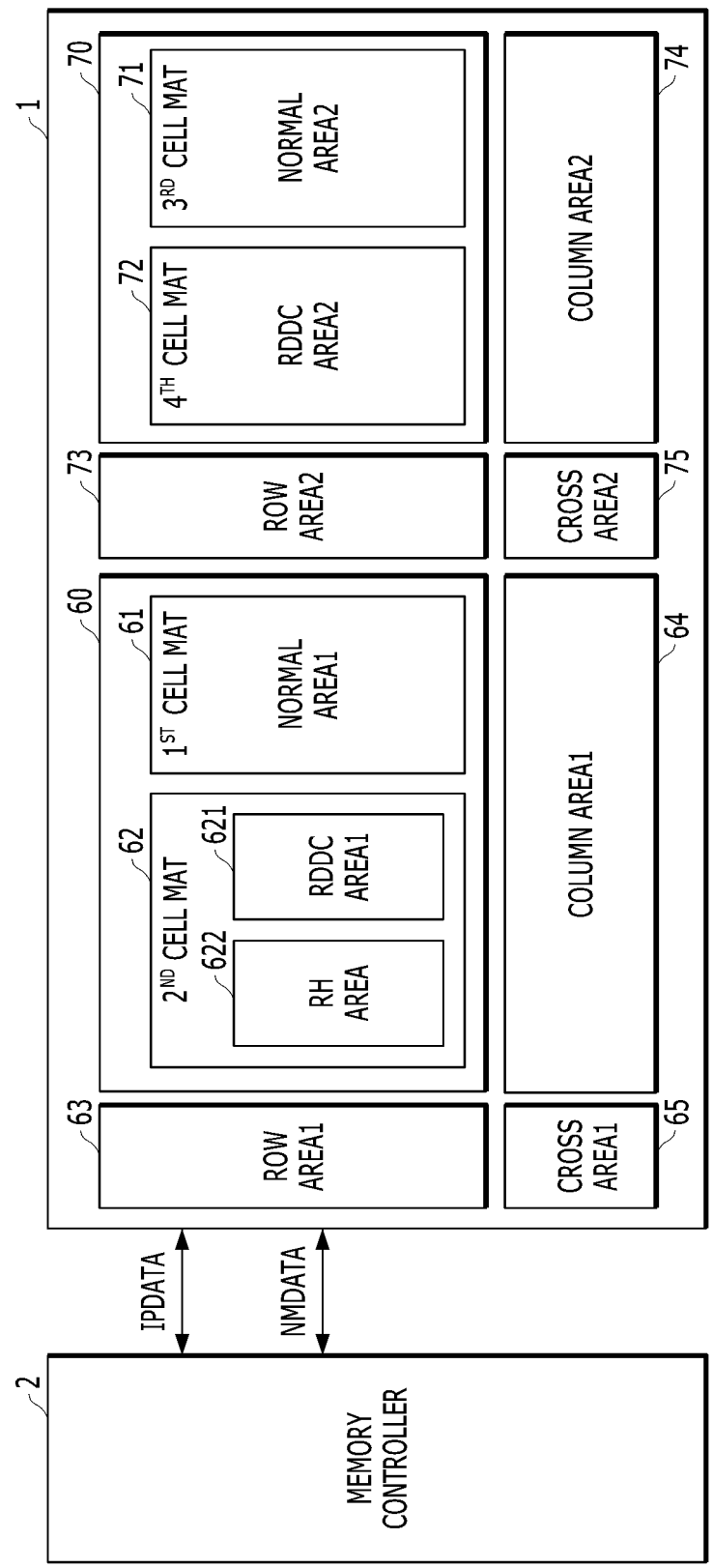
FIG. 7 is a diagram for describing an example of a memory system including the memory device disclosed in FIG. 6 in accordance with an embodiment of the present disclosure.

In an embodiment, the normal data stored in the first normal area NORMAL AREA1 61 or the first redundancy area RDDC AREA1 621 included in the first memory bank 60 may be important data IPDATA (see FIG. 7). The normal data stored in the second normal area NORMAL AREA2 71 or the second redundancy area RDDC AREA2 72 included in the second memory bank 70 may be normal data NMDATA (see FIG. 7) having lower reliability than the important data IPDATA.

Since the memory device 1 disclosed in FIG. 6 includes the two memory banks 60 and 70, the column repair circuit 84 may be divided into two circuits 85 and 86. However, the two circuits 85 and 86 included in the column repair circuit 84 may be operated in the same manner as the column repair circuit 30 included in the memory device 1 disclosed in FIG. 1.

That is, a first column repair circuit 85 of the column repair circuit 84, corresponding to the first memory bank 60, may repair the bit line BL1 of the first normal area 61 with the bit line RBL1 of the first redundancy area 621, when the bit line BL1 has a defect. Furthermore, a second column repair circuit 86 of the column repair circuit 84, corresponding to the second memory bank 70, may repair the bit line BL2 of the second normal area 71 with the bit line RBL2 of the second redundancy area 721, when the bit line BL2 has a defect.

FIG. 7 is a diagram for describing an example of a memory system including the memory device disclosed in FIG. 6 in accordance with an embodiment of the present disclosure.

Referring to FIG. 7, the memory system may include the memory device 1 and a memory controller 2. The memory device 1 may indicate the memory device 1 disclosed in FIG. 6.

Although not illustrated in detail in FIG. 6, a first row area ROW AREA1 63 may be located on one side of the right and left sides of the first memory bank 60 in FIG. 7. FIG. 7 shows that the first row area 63 is located on the left side of the first memory bank 60. Furthermore, a first column area COLUMN AREA1 64 may be located on one side of the top and bottom sides of the first memory bank 60. FIG. 7 shows that the first column area 64 is located on the bottom side of the first memory bank 60. Furthermore, a first cross area CROSS AREA1 65 may be located between the first row area 63 and the first column area 64.

A second row area ROW AREA2 73 may be located on one side of the right and left sides of the second memory bank 70. FIG. 7 shows that the second row area 73 is located on the left side of the second memory bank 70. Furthermore, a second column area COLUMN AREA2 74 may be located on one side of the top and bottom sides of the second memory bank 70. FIG. 7 shows that the second column area 74 is located on the bottom side of the second memory bank 70. Furthermore, a second cross area CROSS AREA2 75 may be located between the second row area 73 and the second column area 74.

For reference, FIG. 7 illustrates that the first memory bank 60 is located on the left side of the second memory bank 70. However, this is only an embodiment, and vice versa. That is, the first memory bank 60 may be located on the right side of the second memory bank 70.

Between the cell mats 61 and 62 included in the first memory bank 60, the second cell mat 62 may be located closer to the first row area 63 than the first cell mat 61. When the first row area 63 is located on the left side of the first memory bank 60 as illustrated in FIG. 7, the second cell mat 62 may be located on the left side and the first cell mat 61 may be located on the right side, in the first memory bank 60. When the first row area 63 is located on the right side of the first memory bank 60 unlike the configuration illustrated in FIG. 7, the second cell mat 62 may be located on the right side and the first cell mat 61 may be located on the left side, in the first memory bank 60.

The row hammer area 622 included in the second cell mat 62 of the cell mats 61 and 62 included in the first memory bank 60 may be located closer to the first row area 63 than the first redundancy area 621. As illustrated in FIG. 7, when the first row area 63 is located on the left side of the first memory bank 60 such that the second cell mat 62 is located on the left side and the first cell mat 61 is located on the right side, in the first memory bank 60, the row hammer area 622 may be located on the left side and the first redundancy area 621 may be located on the right side, in the second cell mat 62. Unlike the configuration illustrated in FIG. 7, when the first row area 63 is located on the right side of the first memory bank 60 such that the second cell mat 62 is located on the right side and the first cell mat 61 is located on the left side, in the first memory bank 60, the row hammer area 622 may be located on the right side and the first redundancy area 621 may be located on the left side, in the second cell mat 62.

For reference, FIG. 7 illustrates that the third cell mat 71 is located on the right side and the fourth cell mat 72 is located on the left side, in the second memory bank 70. This is only an example, and the third cell mat 71 may be located on the left side and the fourth cell mat 72 may be located on the right side, in the second memory bank 70. In particular, in the second memory bank 70, a specific cell mat does not need to be located closer to the second row area 73.

The memory controller 2 may store important data IPDATA whose storage reliability needs to be set to a high level, among data inputted/outputted to/from the outside (e.g., host), in the first memory bank 60. That is, the memory controller 2 may store the important data IPDATA in the first normal area NORMAL AREA1 61 or the first redundancy area RDDC AREA1 621 included in the first memory bank 60.

In the first memory bank 60, entries of the count RCN corresponding to all word lines WL commonly coupled to the first and second cell mats 61 and 62 may be saved in the row hammer area 622 included therein. Therefore, a smart refresh operation may be performed on the important data IPDATA stored in the first memory bank 60 through the process described with reference to FIGS. 1 to 4.

The memory controller 2 may store the normal data NMDATA whose storage reliability may be set to a lower level than the important data IPDATA, among the data inputted/outputted to/from the outside (e.g., host), in the second memory bank 70. That is, the memory controller 2 may store the normal data NMDATA in the second normal area NORMAL AREA2 71 or the second redundancy area RDDC AREA2 721 included in the second memory bank 70.

Since the second memory bank 70 has no row hammer area unlike the first memory bank 60, the smart refresh operation may not be performed on the normal data NMDATA stored in the second memory bank 70.

In an embodiment, an operation of determining whether the data inputted/outputted to/from the outside (e.g., host) is the important data IPDATA or the normal data NMDATA may be performed by the external host. That is, data transferred from the outside (e.g., host) may be transferred to the memory controller 2, after the importance of the data was already determined, and the memory controller 2 may perform only an operation of checking the importance of the transferred data and then selecting a storage area according to the check result, i.e., an operation of selecting whether to store the data in the first or second memory bank 60 or 70.

In an embodiment, the operation of determining whether the data inputted/outputted to/from the outside (e.g., host) is the important data IPDATA or the normal data NMDATA may be performed by the memory controller 2. That is, the memory controller 2 may perform only an operation of determining the tendency or characteristic of data transferred from the outside (e.g., host), and then selecting a storage area according to the determination result, i.e., an operation of selecting whether to store the data in the first or second memory bank 60 or 70.

Although various embodiments have been described for illustrative purposes, it will be apparent to those skilled in the art that various changes and modifications may be made without departing from the spirit and scope of the invention as defined in the following claims. Furthermore, the embodiments may be combined to form additional embodiments.

What is claimed is:

1. A memory device comprising:
   a memory bank comprising a first cell mat used as a normal area and a second cell mat used as a row hammer area and a redundancy area, each of the areas being an array of memory cells;
   a target address generation circuit suitable for:
      saving, in the row hammer area, a count of a received address for an active operation on the memory bank by performing an internal access operation on the row hammer area during the active operation, and
      setting, a particular count which satisfies a preset condition, an address corresponding to the particular count as a target address;
   a refresh control circuit suitable for controlling a smart refresh operation on the target address; and
   a column repair circuit suitable for repairing, when a bit line of the normal area has a defect, the bit line of the normal area with a bit line of the redundancy area.

2. The memory device of claim 1, wherein the row hammer area is coupled to a plurality of word lines and at least one first bit line and the redundancy area is coupled to the word lines and at least one second bit line.

3. The memory device of claim 2,
   wherein the target address generation circuit and the refresh control circuit are in a row area located on a row-direction side of the memory bank and the column repair circuit is in a column area located on a column-direction side of the memory bank, and
   wherein the second cell mat is located closer to the row area than the first cell mat.

4. The memory device of claim 3, wherein the first bit line is located closer to the row area than the second bit line.

5. The memory device of claim 4,
   wherein a bit line of the first cell mat and the second bit line are coupled to the column area through a first segment line, and
   wherein the first bit line is coupled to the row area through a second segment line which is physically isolated from the first segment line.

6. The memory device of claim 5, wherein the second cell mat is further coupled to a third bit line that is located between the first bit line and the second bit line and is physically isolated from the first segment line and the second segment line.

7. The memory device of claim 1, wherein the smart refresh operation is an operation of refreshing one or more word lines adjacent to a word line corresponding to the target address among a plurality of word lines coupled to the memory bank.

8. The memory device of claim 5, wherein the target address generation circuit comprises:
an area control circuit suitable for:
updating, during the active operation, the count read from the row hammer area, the read count corresponding to the received address, and
saving, during the active operation, the updated count in the row hammer area;
a saving circuit suitable for:
updating, during the active operation, a candidate count to the updated count when the updated count is greater than a current value of the candidate count,
generating a flag signal whenever updating the candidate count, and
resetting the candidate count in response to a reset signal; and
a target address output circuit suitable for:
saving therein the received address as the target address in response to the flag signal,
outputting the target address to the memory bank during the smart refresh operation, and
generating the reset signal after the smart refresh operation is performed.

9. The memory device of claim 8, wherein the area control circuit is further suitable for:
reading, through the second segment line, the count from the row hammer area based on the received address,
writing, through the second segment line, the updated count into the row hammer area, and
resetting, within the row hammer area, the count corresponding to the target address in response to the reset signal.

10. The memory device of claim 9, further comprising a normal operation control circuit suitable for:
reading out, through the first segment line, first data from one of the first cell mat and the redundancy area based on the receive address, and
writing, through the first segment line, second data to one of the first cell mat and the redundancy area based on the receive address.

11. A memory system comprising:
a memory device comprising a first memory bank including a first cell mat used as a first normal area and a second cell mat used as a row hammer area and a first redundancy area, and a second memory bank including a third cell mat used as a second normal area and a fourth cell mat used as a second redundancy area, each of the areas being an array of memory cells; and
a memory controller suitable for storing important data in the first memory bank, and storing normal data in the second memory bank, the normal data having lower reliability than the important data,
wherein the memory device comprises:
a target address generation circuit suitable for saving, in the row hammer area, a count of a received address for an active operation on the first memory bank by performing an internal access operation on the row hammer area during the active operation, and setting, a particular count which satisfies a preset condition, an address corresponding to the particular count as a target address;
a refresh control circuit suitable for controlling a smart refresh operation on the target address; and
a column repair circuit suitable for repairing, when a bit line of the first normal area has a defect, the bit line of the first normal area with a bit line of the first redundancy area, and repairing, when a bit line of the second normal area has a defect, the bit line of the second normal area with a bit line of the second redundancy area.

12. The memory system of claim 11, wherein the row hammer area is coupled to a plurality of word lines and at least one first bit line and the first redundancy area is coupled to the word lines and at least one second bit line.

13. The memory system of claim 12,
wherein the target address generation circuit and a first refresh control circuit of the refresh control circuit, corresponding to the first memory bank, are in a first row area located on one side of the right and left sides of the first memory bank,
wherein a first column repair circuit of the column repair circuit, corresponding to the first memory bank, is in a first column area located on one side of the top and bottom sides of the first memory bank,
wherein a second refresh control circuit of the refresh control circuit, corresponding to the second memory bank, is in a second row area located on one side of the right and left sides of the second memory bank,
wherein a second column repair circuit of the column repair circuit, corresponding to the second memory bank, is in a second column area located on one side of the top and bottom sides of the second memory bank, and
wherein the second cell mat is located closer to the first row area than the first cell mat.

14. The memory system of claim 13, wherein the first bit line is located closer to the first row area than the second bit line.

15. The memory system of claim 14, wherein a bit line of the first cell mat and the second bit line are coupled to the first column area through a first segment line,
wherein the first bit line is coupled to the first row area through a second segment line which is physically isolated from the first segment line, and
wherein a plurality of bit lines included in the second memory bank are coupled to the second column area through a third segment line.

16. The memory system of claim 15, wherein the second cell mat is further coupled to a third bit line that is located between the first bit line and the second bit line and is physically isolated from the first segment line and the second segment line.

17. The memory system of claim 11, wherein the smart refresh operation is an operation of refreshing one or more word lines adjacent to a word line corresponding to the target address, among a plurality of word lines coupled to in the first memory bank.

18. The memory system of claim 15, wherein the target address generation circuit comprises:
an area control circuit suitable for:
updating, during the active operation, the count read from the row hammer area, the read count corresponding to a first received address, and
saving, during the active operation, the updated count in the row hammer area;
a saving circuit suitable for:
updating, during the active operation, a candidate count to the updated count when the updated count is greater than a current value of the candidate count, and generating a flag signal whenever updating the candidate count, and resetting the candidate count in response to a reset signal; and a target address output circuit suitable for:

saving therein the first received address as the target address in response to the flag signal, outputting the target address to the first memory bank during the smart refresh operation, and generating the reset signal after the smart refresh operation is performed.

19. The memory system of claim 18, wherein the area control circuit is further suitable for:

reading, through the second segment line, the count from the row hammer area based on the first received address writing, through the second segment line, the updated count into the row hammer area, and resetting, within the row hammer area, the count corresponding to the target address, in response to the reset signal.

20. The memory system of claim 19, further comprising a normal operation control circuit suitable for:

reading out, through the first segment line, first important data from one of the first cell mat and the first redundancy area based on the first receive address;

reading out, through the third segment line, first normal data from one of the third cell mat and the second redundancy area based on a second received address;

writing, through the first segment line, second important data to one of the first cell mat and the first redundancy area based on the first receive address; and writing, through the third segment line, second normal data to one of the third cell mat and the second redundancy area based on the second receive address.

* * * * *